United States Patent [19]

Frijlink

[11] Patent Number: 4,722,911

[45] Date of Patent: Feb. 2, 1988

[54] VAPOR PHASE EPITAXY USING COMPLEX PREMIXING SYSTEM

[75] Inventor: Peter M. Frijlink, Crosne, France

[73] Assignee: U.S. Philips Corporation, New York, N.Y.

[21] Appl. No.: 862,063

[22] Filed: May 12, 1986

[30] Foreign Application Priority Data

May 13, 1985 [FR] France ................................ 85 07204

[51] Int. Cl.$^4$ ................... H01L 21/205; H01L 21/66; H01L 21/90
[52] U.S. Cl. ...................................... 437/110; 437/87; 437/126; 437/133; 156/611; 156/613; 156/614; 118/719
[58] Field of Search ....................... 29/576 E; 137/117; 148/1.5, 174, 175, DIG. 65; 156/610–615; 427/51, 87; 118/719

[56] References Cited

U.S. PATENT DOCUMENTS

| | | | |
|---|---|---|---|
| 4,095,004 | 6/1978 | Fraas et al. | 427/74 |
| 4,172,756 | 11/1979 | Hollan | 156/614 |
| 4,190,470 | 2/1980 | Walline | 148/175 |
| 4,201,604 | 5/1980 | Bierig et al. | 148/175 |
| 4,279,670 | 7/1981 | Steele | 148/175 |
| 4,368,098 | 1/1983 | Manasevit | 156/606 |
| 4,517,220 | 5/1985 | Rose | 427/8 |
| 4,533,410 | 8/1985 | Ogura et al. | 148/175 |
| 4,588,451 | 5/1986 | Vernon | 148/175 |

Primary Examiner—Brian E. Hearn
Assistant Examiner—William Bunch
Attorney, Agent, or Firm—Paul R. Miller

[57] ABSTRACT

A method of manufacturing a semiconductor device is set forth including the step of depositing from a vapor phase crystalline layers on a substrate in a chamber of a reactor (R) by means of vector gases and reacting gases. The vector gases and reacting gases are introduced into the chamber of the reactor by means of one or several systems of tubes, each system composed on the one hand of a main tube (P), one end of which merges into the reactor (R) and the other end of which merges at an outlet (E), and on the other hand of three secondary tubes (6,5,7) designated as first (6), second (5) and third (7) secondary tubes with the main tube (P) comprising four restrictions (1,2,3,4) between which the three respective secondary tubes merge. The first secondary tube (6) merges closest to the reactor (R). The first (6) and third (7) secondary tubes serve to transport the vector gas(es) at a flow rate $D_1$ and $D_3$, respectively, while the second (5) secondary tube serves to transport the reacting gas at a flow rate $D_2$.

This system of tubes:
(a) is equivalent to a valve guiding the reacting gas to the reactor (R) when $D_3 > D_1$ and $D_3 > D_2$, and
(b) is equivalent to a valve guiding the reacting gas to the outlet (E) when $D_1 > D_3$ and $D_1 > D_2$.

4 Claims, 4 Drawing Figures

VAPOR PHASE EPITAXY USING COMPLEX PREMIXING SYSTEM

The invention relates to a method of manufacturing a semiconductor device including the step of depositing from a vapour phase crystalline layers on a substrate in a chamber of a reactor by means of vector gases and reacting gases.

The term "reacting gas" is to be understood to mean any gas required for carrying out a reaction or an operation.

The term "reactor" is to be understood to mean any place or any space in which the operation or the reaction is effected.

The term "vector gas" is to be understood to mean any gas which is compatible with the reaction or operation, but which does not necessarily participate in this operation of reaction. This may be, for example, a gas which is completely neutral with respect to the reaction or constitutes the atmosphere or medium suitable for satifactorily carrying out the reaction.

The invention is used in the manufacture of active semiconductor devices including epitaxial layers or implanted layers, for example of materials from the III-V group.

It is known from U.S. Pat. No. 3,930,908 to introduce into the chamber of a reactor for epitaxy from the vapour phase by means of valves of conventional structure, reacting gaseous compounds mixed with a vector gas. The regulation, the interruption and/or the changeover of the flow of these gases are then effected, as circumstances may require, by opening or closing valves causing mechanical parts to be relatively displaced.

However, the use of these conventional valves proves to be difficult and even impossible in numerous cases and especially:
when the gases used are corrosive,
when these gases are polluting and a decontamination is necessary in order to obtain the subsequent changeover with another gas, this decontamination is made difficult due to the fact that the materials constituting the valves are mostly attacked by the products utilized for decontamination,
when these gases have to be kept at high temperature during their flow, which may be the case with gaseous compounds which crystallize at ambient temperatures or solidify in fact at the high temperatures of epitaxy from the vapour phase, such as temperatures lying between 600° and 900° C., and the materials satisfying the purity conditions imposed by the epitaxy from the vapour phase are not materials which permit obtaining in a simple manner valves which satisfy the conditions of tightness, and
when these gases have to be used at very low flow rates or in very small quantities, in fact the parasitic pressure variations due to the change-over can lead to errors in the thickness of the epitaxial layers or to errors in the doping of the layers formed.

Thus, for these reasons, in general with epitaxy from the vapour phase, metals or ceramic materials are excluded because of the fact that they can contaminate or can be attacked by the reacting gas.

On the other hand, thicknesses of very thin layers, abrupt changes of composition of abrupt changes of doping cannot be obtained by means of the valves of conventional structure.

For all these reasons, the conventional valves have to be avoided.

Therefore, the invention has for its object to provide a method of manufacturing, which does not suffer from these limitations.

According to the invention, this object is achieved by means of a method of the kind defined in the opening paragraph, characterized in that the vector gases and reacting gases are introduced into the chamber of the reactor by means of one or several systems of tubes, each composed on the one hand of a main tube having one end merging into the reactor and the other end merging at an outlet, and on the other hand of three secondary tubes designated as first, second and third secondary tubes with the main tube including four restrictions between which the three respective secondary tubes merge and with the first secondary tube merging closest to the reactor, and further that the first and third secondary tubes serve to transport the vector gas or gases at the respective flow rates $D_1$ and $D_3$, while the second secondary tube serves to transport the reacting gas at the flow rate $D_2$ in such a manner that this sytem of tubes:

(a) is equivalent to a valve guiding the reacting gas to the reactor when $D_3 > D_1$ and $D_3 > D_2$, or
(b) is equivalent to a valve guiding the reacting gas to the outlet when $D_1 > D_3$ and $D_1 > D_2$.

The method according to the invention has inter alia the following advantages:
the system of tubes, which each constitutes the means for introducing the reacting gases into the chamber can be made of a material, such as quartz, to satisfy the purity conditions resulting in that epitaxial layers of a very high quality can be obtained; moreover, when the system of tubes is made of such a material, the decontamination that may be effected is readily obtained, for example, by means of a chlorinated gas, which ensures that the use of the method of forming the epitaxial layer becomes simpler and the maintenance of the quality of the layers in the course of time is guaranteed;
since the system of tubes permits a quick change-over without a dead space in which the gas remains stagnant and in which traces of gaseous components are obtained after change-over, thicknesses of very thin layers, abrupt changes of composition or abrupt changes of doping can be obtained.

In general, by means of the method according to the invention, the epitaxial or implanted layers are obtained in a simpler manner and are of higher quality.

In order that the invention may be readily carried out, it will now be described more fully with reference to the accompanying drawings, in which.

Figure 1A:
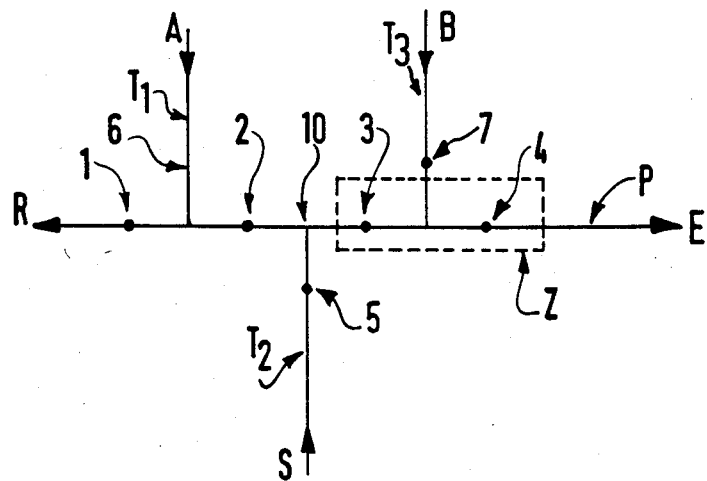
FIG. 1a shows diagrammatically the arrangement according to the invention.

As shown in FIG. 1a, the arrangement used in the method of manufacturing a semiconductor device according to the invention comprises a system of tubes P, $T_1$, $T_2$ and $T_3$ provided with restrictions 1, 2, 3, 4, 5, 6 and 7.

Especially this system of tubes is constituted by a main tube P provided with four restrictions 1, 2, 3 and 4. A secondary tube $T_1$ merges between the restrictions 1 and 2 into P; a secondary tube $T_2$ merges between the restrictions 2 and 3; and a secondary tube $T_3$ merges between the restrictions 3 and 4.

The end of the tube P situated on the side of the restrictions 1 merges into a reactor R or into a space R for utilizing a so-called reacting gas S. This reacting gas S is introduced into the arrangement through the second secondary tube $T_2$. The other end of the main tube P is an outlet E of the arrangement to a space, for example, for regeneration of the gases not used in the reactor.

Into the tubes $T_1$ and $T_3$ are introduced so-called vector gases, which may be neutral with respect to the use made of the reacting gases in the reactor or may be compatible with this use and may finally form the medium or atmosphere suitable for the realization of the reaction. This may also be a reacting gas in certain quantities.

Figure 1B:
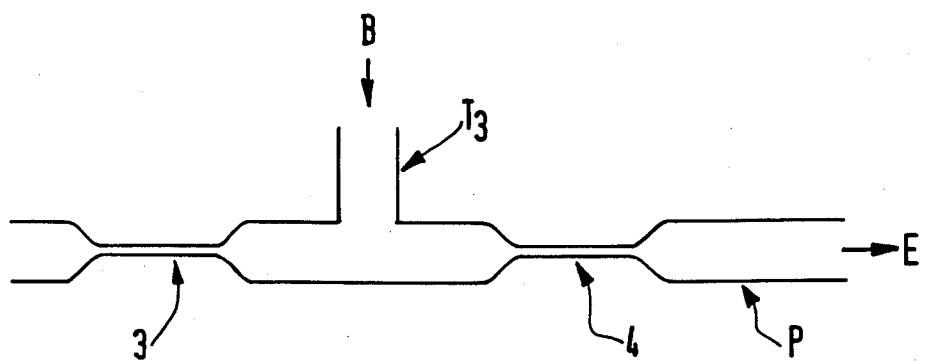
FIG. 1b shows in elevation and on an enlarged scale the tube portions of the zone Z of FIG. 1a shown by a broken line.

A detail of the zone Z of the arrangement according to the invention is shown in FIG. 1b on an enlarged scale with respect to FIG. 1a. The restrictions 3 and 4 shown therein are contractions of the cross-section of the main tube P over a given length. The tube $T_3$ merges with the main tube P between these two contractions.

The other contractions and the other openings of the secondary tube of the arrangement are entirely identical to the structure shown in FIG. 1b.

When the gases introduced through the secondary tubes $T_1$, $T_2$, $T_3$ are given flow rates $D_1$, $D_2$ and $D_3$, respectively, several situations are obtained.

In the first place, when the flow rates $D_1$ and $D_3$ of the vector gases are absolutely equal to each other, the gas flow of the reacting gas S is subdivided into two equal parts, one of which flows in the direction of R and the other of which flows in the direction of E.

In the second place, when the flow rate $D_1$ is increased and/or the flow rate $D_3$ is decreased with, the flow rate in the restrictions 2 being chosen sufficiently high to prevent a detrimental retrodiffusion of the reactant gas S against the direction of flow, the direction of the flow in the restriction 2 is inverted with respect to the preceding situation and the reacting gas flows entirely in the direction of the outlet E. This corresponds to the conditions in which $$D_1 > D_3 \text{ and } D_1 > D_2.$$

In the third place, when the flow rate $D_3$ is increased and/or the flow rate $D_1$ is decreased with, the flow rate in the restriction 3 being chosen sufficiently high to prevent a detrimental retrodiffusion of the reactant S in the restriction 2 against the direction of flow, the reactant gas S flows entirely; in the direction of the outlet R. This corresponds to the conditions in which:

$$D_3 > D_1 \text{ and } D_3 > D_2.$$

In order to avoid the return of the gases to their source, each of the secondary tubes $T_1$, $T_2$, $T_3$ may moreover be provided with restrictions 6, 5 and 7, respectively.

The system of tubes described above may advantageously be used to introduce the different reacting gases into a reactor intended to form crsytalline layers by epitaxy from the gaseous phase.

Figure 2:
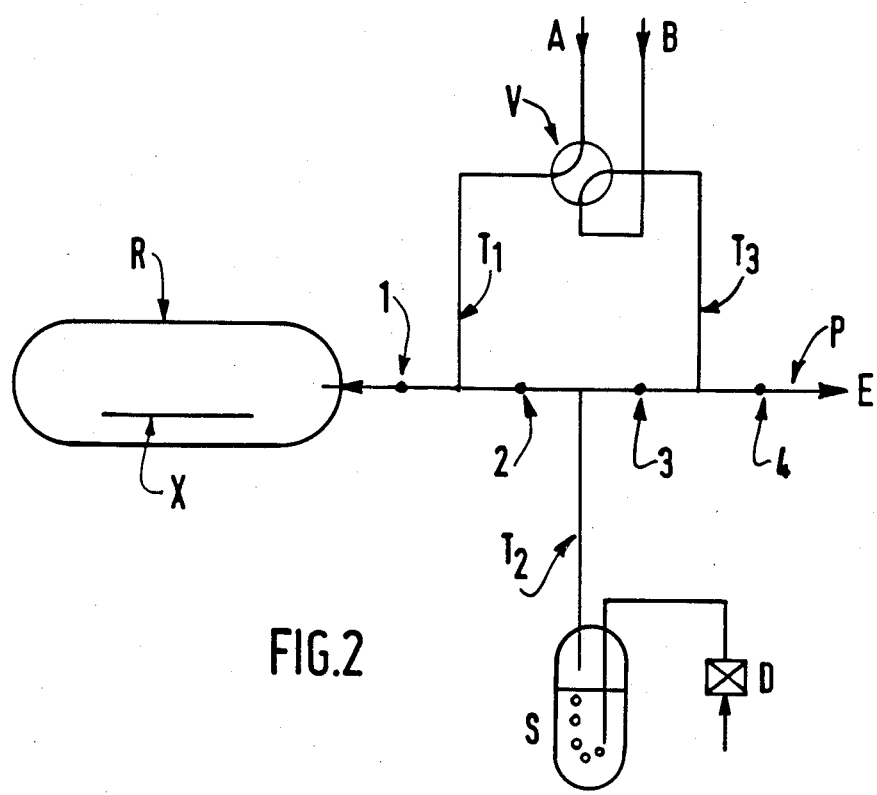
FIG. 2 shows diagrammatically a reactor for depositing crystalline layers by epitaxy from the gaseous phase, with this reactor being provided with an arrangement according to the invention.

As shown in FIG. 2, a system for epitaxy from the gaseous phase comprises a reactor R having a sample X and a source bottle S of a reacting gas to be introduced into R through an arrangement according to the invention is provided with, $D_1$ being a flow meter.

In order to deposit on the sample X consisting of a monocrystalline substrate epitaxial layers having a very accurate position and doping, it is absolutely necessary that the partial pressure of the reacting gases in the deposition chamber R is accurately controlled at any instant. Moreover, an alternate arrangement of very thin layers may also be desired. In this case, the partial pressure of each of the reacting gases has to be accurately controlled.

Now, if gases are introduced into the reactor R from several different source bottles, such as S, and the changeover between these different sources is effected by means of simple valves, it is not likely that the overall pressure of the gases at the outlet of the sources remains constant.

In fact, these source bottles in the spaces situated above the starting product are filled with a given quantity of saturated vapour of the latter. The changes of pressure at the change-over instant leads to an undesired escape of saturated vapour from this space to the reaction chamber R. Thus, the change-over of a valve of the conventional type may produce at the outlet of a source a variation of pressure of the order of 1%, which results in a premature deposition of an epitaxial layer of several nanometres on the substrate.

When a conventional valve is replaced by an arrangement of the kind described above disposed between the gas source S and the reaction chamber R, these problems can be obviated, as shown by the method of obtaining crystalline layers described below by way of example, in which this arrangement is utilized.

Figure 3:
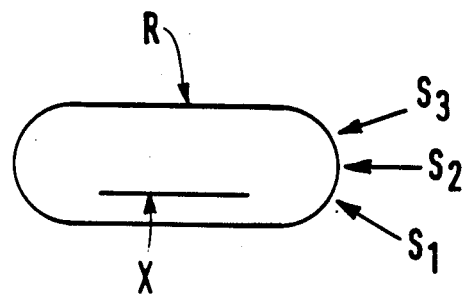
FIG. 3 shows diagrammatically a reactor provided with different reacting gas sources by means of arrangements according to the invention.

The arrangement used is that shown in FIG. 3 with several reacting gases $S_1$, $S_2$, $S_3$ being used and each being carried to the reactor through an arrangement as shown in FIG. 2.

The system is arranged for obtaining the alternate arrangement of layers of gallium arsenide (GaAs) and of gallium aluminium arsenide ($Ga_{1-x}Al_xAs$) on a substrate of gallium arsenide (GaAs) by the organometallic method from trimethyl gallium (TMG), trimethyl aluminium (TMA) and arsine ($AsH_3$) in a hydrogen atmosphere or a helium atmosphere.

A bottle $S_1$ will supply, for example, the TMG; a bottle $S_2$ will supply the TMA and the arsine will be introduced through $S_3$ in gaseous form. Each of these products will be introduced at the desired instant into the reactor through the path intended for the reacting gas of an arrangement identical to the arrangement shown in FIG. 2. The vector gas chosen will in this case be gaseous hydrogen or a neutral gas.

The flow rate of the vector gas of high value will be of the order of 200 $cm^3$/min and that of the vector gas of low value of the order of 50 $cm^3$/min.

The flow rate of the reactant is of an order lower than that of the flow rate of the vector gas of high value.

By means of the arrangement shown in FIG. 3, a composite structure of alternately arranged layers may be obtained, such as a first layer of GaAlAs of 2 μm on the substrate of GaAs, then a thin layer of GaAs of 4 nm and subsequently a second layer of GaAlAs of 2 μm. This type of composite structure is necessary to obtain semiconductor devices such as, for example, quantum well lasers.

The thin layers of gallium arsenide are obtained by combination in the reactor of gaseous arsenic and of vapours of TMG originating from the source bottle $S_1$. The thick layers of gallium aluminium arsenide are obtained by combination in the reactor of gaseous arsenic and of vapours of TMG and of TMA originating from the source bottle $S_1$ and the source bottle $S_2$, respectively.

It is clear that layers having a thickness of only 4 nm could not be obtained in a reproducible manner with an arrangement known from the prior art because the higher accuracy in the thickness of the layers was several nm.

According to the invention, by causing each product to arrive in the reactor through the reactant path of each system of tubes, not only a very small thickness can be obtained for the layers, but also this thickness is prefectly reproducible. Moreover, the concentrations of reactant can be accurately controlled, which is advantageous for obtaining the layers of $Ga_{1-x}Al_xAs$.

In the example described, the tubes had an internal diameter of the order of 3 mm and the restrictions had an internal diameter of the order of 0.3 to 0.5 mm over a length of about 20 mm.

The invention can be realized by means of other gases while using one or several adapted systems of tubes. If the reacting gas has a molecular mass larger than that of the vector gas, the viscosity of the mixture is different and the values of the diameters of the tubes and of the restrictions have to be modified accordingly, like the relative values of the flow rates of the gases. However, the method of change-over remains the same.

For the application to the realization of epitaxial layers, the system of tubes and of restrictions will be preferably made of quartz. In fact, quartz satisfies the optimum purity conditions to obtain such high-quality layers because it does not contaminate the reacting gases and is not attacked by the latter. Moreover, it has the property to be readily freed from the traces of polluting materials deposited on its surface. This system of tubes consequently permits carrying out the change-over of the gases without the use of valves or of unsuitable materials.

What is claimed is:

1. A method of manufacturing a semiconductor device comprising the steps of
    introducing vector gases and reacting gases into a reactor chamber by using at least one system of tubes, said system of tubes including a main tube having one end merging into said reactor chamber and having another end merging at an outlet, and three secondary tubes being designated as first, second, and third secondary tubes, said main tube having four restrictions between which said three secondary tubes respectively merge with said main tube, said first secondary tube merging with said main tube nearest to said reactor chamber, wherein said first secondary tube and said third secondary tube transport said vector gases at respective flow rates of $D_1$ and $D_3$, and wherein said second secondary tube transports said reacting gases at a flow rate of $D_2$, such that said main tube guides said reacting gases to said reactor chamber when $D_3 > D_1$ and $D_3 > D_2$, and said main tube guides said reacting gases to said outlet when $D_1 > D_3$ and $D_1 > D_2$, and
    depositing on a substrate in said reactor chamber crystalline layers from vapor phases by said vector gases and said reacting gases.

2. A method of manufacturing a semiconductor device comprising the steps of
    introducing vector gases and reacting gases into a reactor chamber by using at least one system of quartz tubes, said system of tubes including a main tube having one end merging into said reactor chamber and having another end merging at an outlet, and three secondary tubes being designated as first, second, and third secondary tubes, said main tube having four restrictions between which said three secondary tubes respectively merge with said main tube, said first secondary tube merging with said main tube nearest to said reactor chamber, wherein said first secondary tube and said third secondary tube transport said vector gases at respective flow rates of $D_1$ and $D_3$, and wherein said second secondary tube transports said reacting gases at a flow rate of $D_2$, such that said main tube guides said reacting gases to said reactor chamber when $D_3 > D_1$ and $D_3 > D_2$, and said main tube guides said reacting gases to said outlet when $D_1 > D_3$ and $D_1 > D_2$, and
    depositing on a substrate in said reactor chamber crystalline layers from vapor phases by said vector gases and said reacting gases.

3. A method of manufacturing a semiconductor device comprising the steps of
    introducing vector gases of hydrogen or of a neutral gas and reacting gases into a reactor chamber by using three systems of tubes, each of said systems of tubes including a main tube having one end merging into said reactor chamber and having another end merging at an outlet, and three secondary tubes being designated as first, second, and third secondary tubes, said main tube having four restrictions between which said three secondary tubes respectively merge with said main tube, said first secondary tube merging with said main tube nearest to said reactor chamber, wherein said first secondary tube and said third secondary tube transport said vector gases at respective flow rates of $D_1$ and $D_3$, and wherein said second secondary tube transports said reacting gases at a flow rate of $D_2$, such that said main tube guides said reacting gases to said reactor chamber when $D_3 > D_1$ and $D_3 > D_2$, and said main tube guides said reacting gases to said outlet when $D_1 > D_3$ and $D_1 > D_2$,
    wherein the first system of tubes provides a reacting gas of trimethyl gallium (TMG), the second system of tubes provides a reacting gas of trimethyl aluminum (TMA), and the third system of tubes provides a reacting gas of arsine (AsH3), and
    depositing on a substrate of gallium arsenide (GaAs) in said reactor chamber epitaxial crystalline layers of gallium aluminum arsenide (GaAlAs) and gallium arsenide (GaAs) from vapor phases by said vector gases and said reacting gases.

4. A method according to claim 3, wherein said three systems of tubes are made from quartz.

* * * * *